United States Patent [19]

Gurcan et al.

[11] Patent Number: 5,216,629
[45] Date of Patent: Jun. 1, 1993

[54] ADJUSTING FILTER COEFFICIENTS

[75] Inventors: Mustafa K. Gurcan, Crawley, England; Frank M. De Bekker, Amsterdam, Netherlands; David J. Newton, Guildford, England

[73] Assignee: U.S. Philips Corp., New York, N.Y.

[21] Appl. No.: 845,873

[22] Filed: Mar. 3, 1992

Related U.S. Application Data

[63] Continuation of Ser. No. 765,394, Sep. 20, 1991, abandoned, which is a continuation of Ser. No. 638,034, Jan. 7, 1991, abandoned, which is a continuation of Ser. No. 540,405, Jun. 19, 1990, abandoned, which is a continuation of Ser. No. 290,054, Dec. 23, 1988, abandoned.

[30] Foreign Application Priority Data

Dec. 23, 1987 [GB] United Kingdom ............... 8729988

[51] Int. Cl.⁵ ............................................. G06F 15/31
[52] U.S. Cl. ........................................... 364/724.19
[58] Field of Search ............ 364/724.19, 724.2, 724.16

[56] References Cited

U.S. PATENT DOCUMENTS

| | | | |
|---|---|---|---|
| 4,038,536 | 7/1977 | Feintuch | 364/724.19 |
| 4,145,747 | 3/1979 | Sakaki et al. | 364/724.2 |
| 4,184,129 | 1/1980 | Danjon et al. | 364/724.2 |
| 4,754,419 | 6/1988 | Iwata | 364/724.19 |
| 4,811,360 | 3/1989 | Potter | 364/724.2 |

OTHER PUBLICATIONS

M. A. Soderstrand et al., "Experimental Performance Data for Slowed-down Adaptive Algorithms", Int. J. Electronics, 1982, vol. 53, No. 1, pp. 95-99.

Primary Examiner—David H. Malzahn
Attorney, Agent, or Firm—Jack D. Slobod

[57] ABSTRACT

The weighting coefficients in the coefficient array (3) of a transversal filter (1) are corrected in accordance with the least mean squares algorithm by adding to each coefficient a correction derived from the product of the content of a stage of the filter shift register (2) and the difference between a signal at the filter output (5) and the output signal of a decision element (15). Each coefficient is corrected only once for each n sample periods of a signal applied to the filter input (7), where n is greater than unity, in order to reduce the amount of computation required during each sample period. Each correction is derived from the output of the filter by inserting n of said differences into the coefficient array as respective weighting coefficients and setting any remaining coefficients to zero.

8 Claims, 6 Drawing Sheets

Fig. 3

| $V_1(k)$ | $V_1(k-1)$ | $V_1(k-2)$ | $V_1(k-3)$ | $V_1(k-4)$ | |
|---|---|---|---|---|---|
| $C_1$ | $C_2$ | $C_3$ | 0 | 0 | k |
| 0 | 0 | $e(k)$ | $e(k-1)$ | $e(k-2)$ | |
| $V_1(k+1)$ | $V_1(k)$ | $V_1(k-1)$ | $V_1(k-2)$ | $V_1(k-3)$ | |
| $C_1$ | $C_2$ | $C_3$ | 0 | 0 | k+1 |
| 0 | 0 | $e(k)$ | $e(k-1)$ | $e(k-2)$ | |
| $V_1(k+2)$ | $V_1(k+1)$ | $V_1(k)$ | $V_1(k-1)$ | $V_1(k-2)$ | |
| $C_1$ | $C_2$ | $C_3$ | 0 | 0 | k+2 |
| 0 | 0 | $e(k)$ | $e(k-1)$ | $e(k-2)$ | |
| $V_1(k+3)$ | $V_1(k+2)$ | $V_1(k+1)$ | $V_1(k)$ | $V_1(k-1)$ | |
| $C_1$ | $C_2$ | $C_3$ | 0 | 0 | k+3 |
| 0 | 0 | $e(k+3)$ | $e(k+2)$ | $e(k+1)$ | |

Fig. 4

| $V_1(k)$ | $V_1(k-1)$ | $V_1(k-2)$ | $V_1(k-3)$ | $V_1(k-4)$ |
|---|---|---|---|---|
| $C_1$ | $C_2$ | $C_3$ | $C_4$ | 0 |
| 0 | 0 | 0 | $e(k)$ | $e(k-1)$ |
| 0 | 0 | $e(k)$ | $e(k-1)$ | 0 |

$k$ ↓

| $V_1(k+1)$ | $V_1(k)$ | $V_1(k-1)$ | $V_1(k-2)$ | $V_1(k-3)$ |
|---|---|---|---|---|
| $C_1$ | $C_2$ | $C_3$ | $C_4$ | 0 |
| 0 | 0 | $e(k)$ | $e(k-1)$ | 0 |
| 0 | $e(k)$ | $e(k-1)$ | 0 | 0 |

$k+1$ ↓

| $V_1(k+2)$ | $V_1(k+1)$ | $V_1(k)$ | $V_1(k-1)$ | $V_1(k-2)$ |
|---|---|---|---|---|
| $C_1$ | $C_2$ | $C_3$ | $C_4$ | 0 |
| 0 | 0 | 0 | $e(k+2)$ | $e(k+1)$ |
| 0 | 0 | $e(k+2)$ | $e(k+1)$ | 0 |

$k+2$ ↓

ADJUSTING FILTER COEFFICIENTS

This is a continuation of application Ser. No. 765,394, filed Sep. 20, 1991, now abandoned which is a continuation of Ser. No. 638,034 filed Jan. 7, 1991, now abandoned which is a continuation of Ser. No. 540,405 filed Jun. 19, 1990, now abandoned which is a continuation of Ser. No. 290,054 filed Dec. 23, 1988, now abandoned.

BACKGROUND OF THE INVENTION

This invention relates to a method of adjusting the weighting coefficients corresponding to N successive stages of a transversal filter according to the least means squares algorithm, in which method signal samples are supplied to the filter in succession, differences between output signals of the filter and a reference are determined, which output signals each result from a respective group of N of said samples being weighted by said weighting coefficients, and a respective correction derived from the product of a said difference and the current content of a stage of the filter is applied to each said weighting coefficient. The invention also relates to a modification of such a method in which inter alia the transversal filter is replaced by a decision feedback filter. Moreover the invention relates to arrangements for implementing such methods.

It is often required that the weighting coefficients of a transversal filter be adjusted in order to render the filter characteristic closer to that currently required. For example, such a filter may be employed as a so-called "equaliser" for compensating for distortion to a transmitted signal caused by the imperfect nature of a transmission channel. If the channel characteristics vary with time then, in order that satisfactory equalisation continues to be achieved, it is necessary that the filter characteristic be updated either effectively continuously or periodically to take into account the changed channel characteristics. To this end methods of the general kind defined in the first paragraph are well-known, the "least mean squares algorithm" being one of several algorithms which could be employed for the adjustment process. In the known methods each coefficient is adjusted once for every sample applied to the filter according to the formulae:

$$C_1(k + 1) = C_1(k) + \mu e(k) V_1(k)$$
$$C_2(k + 1) = C_2(k) + \mu e(k) V_2(k)$$
$$\vdots$$
$$C_N(k + 1) = C_N(k) + \mu e(k) V_N(k).$$

where $C_1(k), C_2(k) \ldots C_N(k)$ are the weighting coefficients corresponding to the N successive stages of the filter for a given sample period k of the input signal, $\mu$ is a constant which is usually less than 0.1, $e(k)$ is the difference between the output of the filter and the reference for the given sample period k, and $V_1(k), V_2(k), \ldots V_N(k)$ are the respective contents of the N successive stages of the filter for the given sample period k. This adjustment of every coefficient once for every sample period gives theoretically optimum results in respect of speed of acquisition of the required characteristic. However, the large amount of computation required in order to achieve this implies a relatively large power consumption, which can be a disadvantage in many applications.

SUMMARY OF THE INVENTION

It is an object of the invention to mitigate the aforedescribed disadvantage of the prior art.

According to one aspect of the present invention a method as defined in the first paragraph is characterised in that the filter includes at least one further stage which succeeds the N successive stages and the weighting coefficient corresponding to which is set to zero for the production of each said output signal, in that each of the N coefficients is adjusted only once for each n samples applied to the filter, where n is greater than unity, and in that each correction is derived from the output of the filter after the entering of values representative of a plurality of said differences into the filter as respective weighting coefficients and the setting of any remaining weighting coefficients to zero.

It has now been recognised that the quantity $C_x(k)$ on the right-hand side of each of the above formulae is itself given by a similar formula in which the corresponding quantity on the right-hand side is itself given by a similar formula, etc. etc. Thus, for example, the formula $C_1(k+1) = C_1(k) + \mu e(k) V_1(k)$ can be expanded as follows $$\begin{aligned}
C_N(k + 1) &= C_N(k) + \mu e(k) V_N(k) \\
&= C_N(k - 1) + \mu e(k - 1) V_N(k - 1) + \\
&\quad \mu e(k) V_N(k) \\
&= C_N(k - 2) + \mu e(k - 2) V_N(k - 2) + \\
&\quad \mu e(k - 1) V_N(k - 1) + \mu e(k) V_N(k)
\end{aligned}$$

etc. Once this has been done it becomes apparent that $C_1$ may be adjusted, for example, once for every two sample periods of the input signal using the expression $$C_1(k+1) = C_1(k-1) + \mu[e(k-1) V_1(k-1) + e(k) V_1(k)],$$

provided that the quantities inside the square brackets are known at the relevant time. In fact the quantity $V_1(k-1)$ will still be present in the filter, because $V_1(k-1) = V_2(k)$ so that the only quantity which needs to be saved is $e(k-1)$. Similarly $C_1$ could be adjusted only once for every three samples of the input signal using the relevant expression quoted above provided that the quantities $e(k-2)$ and $e(k-1)$ are saved (and assuming that the filter comprises at least three stages so that the quantity $V_1(k-2) = V_3(k)$ is still present). Moreover, it will be noted that the quantity inside the square brackets above (and the corresponding quantity if $C_1$ were adjusted more infrequently than once for every two sample periods) is in "sum of products" form. This is exactly the form of calculation performed by a transversal filter. Thus, for example, the filter itself can be made to evaluate the quantity inside the square brackets above by the simple expedient of substituting the quantities $e(k)$ and $e(k-1)$ for the weighting coefficients $C_1$ and $C_2$ respectively, and setting any other weighting coefficients to zero.

If, for example, the weighting coefficient $C_N$ is treated in a similar way, we have $$\begin{aligned}
C_1(k+1) &= C_1(k) + \mu e(k) V_1(k) \\
&= C_1(k-1) + \mu e(k-1) V_1(k-1) + \\
&\quad \mu e(k) V_1(k) \\
&= C_1(k-2) + \mu e(k-2) V_1(k-2) + \\
&\quad \mu e(k-1) V_1(k-1) + \mu e(k) V_1(k)
\end{aligned}$$

etc. In this case it will be noted that, if the filter were to have exactly N stages, although the quantity $V_N(k)$ would be present in the filter for the sample period k, the quantities $V_N(k-1)$, $V_N(k-2)$ etc. will have dropped out of the end. Therefore, if one of the above formulae is to be applied then, if $C_N$ is to be adjusted once for every n sample periods of the input signal and a respective said output signal is produced for each signal sample applied to the filter, the filter will have to be provided with at least n−1 further stages succeeding the N stages so that the quantities $V_N(k-1) \ldots V_N(k-(n-1))$ do not drop out until they are no longer needed. Provided that this is done the quantity $[e(k)V_N(k)+e(k-1) V_N(k-1)+ \ldots +e(k-(n-1))V_N(k-(n-1))]$ may be evaluated by means of the filter in a similar way to that set forth above, i.e. by substituting the quantities $e(k), e(k-1) \ldots e(k-(n-1))$ for the coefficients $C_N, C_{N+1}, \ldots C_{N+n-1}$ respectively and setting the remaining coefficients to zero. It should be noted however that in some cases satisfactory results may still be obtained if less than n−1 further stages are provided, so that the corrections for the coefficients which correspond to at least some of the N successive stages are derived using less than the total amount of information which would otherwise be available, the "oldest" of this information being in fact that which is not used.

In order to minimise the amount of calculation carried out serially for each sample period it may be arranged, if a respective said output signal is produced for each signal sample applied to the filter, that n=N and one correction for a coefficient is derived for each sample applied to the filter. However, it may as an alternative be preferred in some circumstances and if N is even, to choose for example n=N/2 and derive two corrections for respective coefficients for each sample applied to the filter. This can allow the total number of stages in the filter to be reduced.

The aforesaid one aspect of the present invention can be employed to adjust the weighting coefficients of a so-called "decision feedback" filter if it is arranged that the input signals to the filter are in multiplexed form. More specifically, it may be arranged that a respective said output signal is produced for each pair of signal samples applied to the filter and that alternate ones of said signal samples are derived from a said output signal via a decision element, and from an external signal source respectively.

According to another aspect the invention provides a method of adjusting the weighting coefficients corresponding to N stages of a decision feedback filter arrangement according to the least mean squares algorithm, said filter arrangement comprising first and second transversal filters having a common output which is coupled to the input of the second filter via a decision element, X successive stages of the first filter and Y successive stages of the second filter together constituting said N stages, in which method signal samples are supplied to the first filter in succession, differences between output signals appearing at said common output and corresponding signals appearing at the decision element output are determined, and a respective correction derived from the product of a said difference and the current content of a stage of a said filter is applied to each said weighting coefficient, each said output signal appearing at said common output resulting from a respective group of X of said samples and Y of the signals derived from the decision element output which are applied to the second filter being weighted by said weighting coefficients, characterised in that the first filter includes at least one further stage which succeeds said X successive stage and the second filter includes at least one further stage which succeeds said Y successive stages, the weighting coefficients corresponding to said further stages being set to zero for the production of each said output signal appearing at said common output, in that each of the N coefficients is adjusted only once for each n samples applied to the first filter, where n is greater than unity, in that each correction for a weighting coefficient corresponding to one of the X stages of the first filter is derived from the output of the first filter after the entering of values representative of a plurality of said differences into the first filter as respective weighting coefficients and the setting of any remaining weighting coefficients therein to zero, and in that each correction for a weighting coefficient corresponding to one of the Y stages of the second filter is derived from the output of the second filter after the entering of values representative of a plurality of said differences into the second filter as respective weighting coefficients and the setting of any remaining weighting coefficients therein to zero.

The invention also provides transversal and decision feedback filter arrangements for implementing the aspects of the invention defined above.

BRIEF DESCRIPTION OF THE DRAWING

Embodiments of the invention will now be described, by way of example, with reference to the accompanying diagrammatic drawings, in which:

FIG. 3 illustrates some information signals occurring in the embodiment of FIG.1, FIG. 4 illustrates some information signals occurring in a modified version of the embodiment of FIG. 1, FIG. 5 illustrates some information signals occurring in another modified version of the embodiment of FIG. 1.

DETAILED DESCRIPTION OF THE PREFERRED EMBODIMENTS

Figure 1:
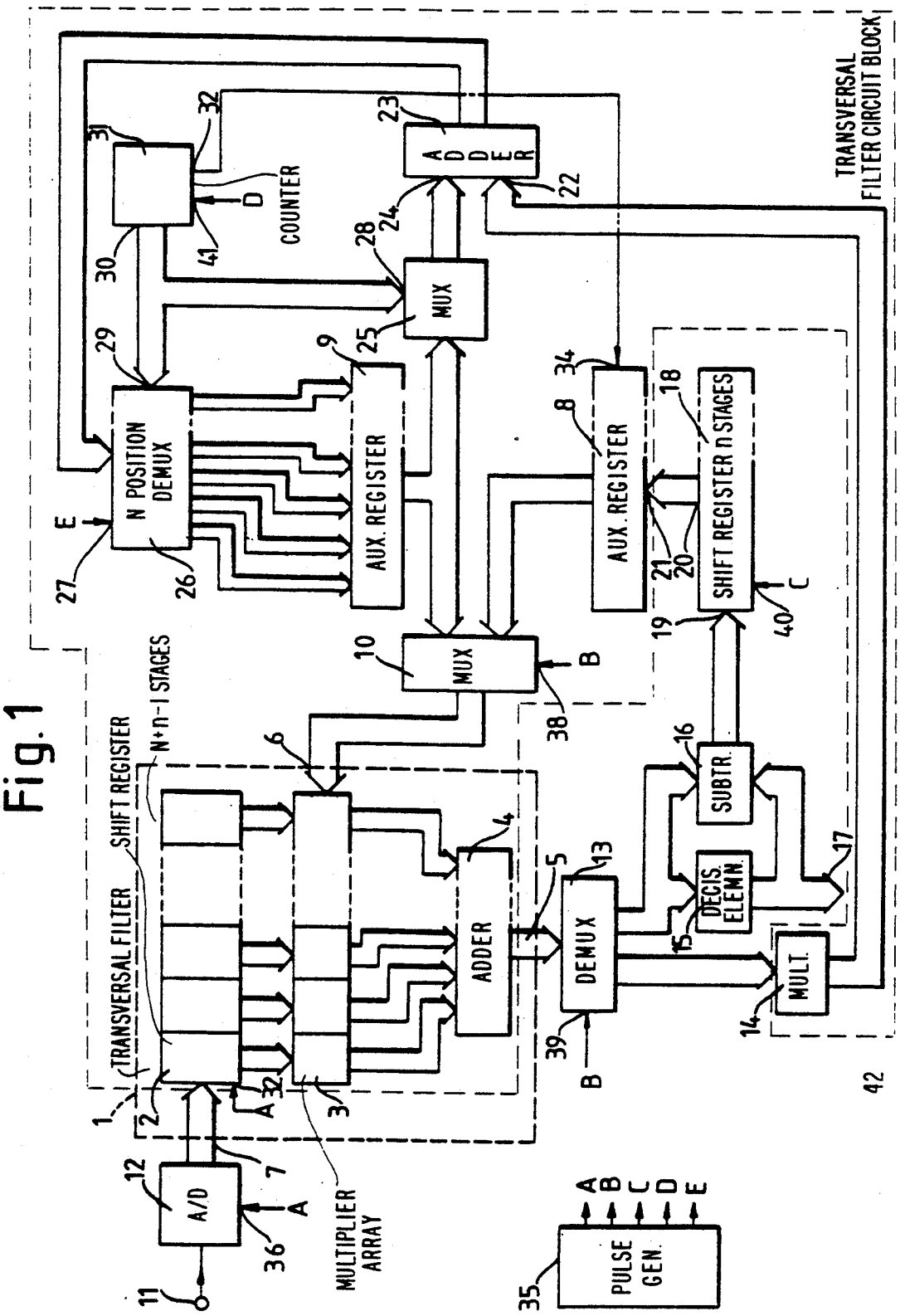
FIG. 1 is a block diagram of a first embodiment of the transversal filter arrangement of the present invention.

With reference to FIG. 1 of the drawing, a transversal filter arrangement comprises a conventional transversal filter 1 in the form of a delay line or shift register 2 having (N+n−1) stages, a multiplier array 3 comprising a respective multiplier corresponding to each stage of the register 2, and an adder 4 which adds together the outputs of all the multipliers of the array 3 and produces the result on an output 5. Each multiplier of the array 3 has a first input coupled to an output of the corresponding stage of the register 2 and a second input fed from a respective group of bit-lines of a multiple input 6 and multiplies the content of the corresponding stage of the register 2 by a (digital) quantity applied in operation to the respective group of bit lines of the input 6. The serial input 7 of the shift register 2 is also multibit, as is the storage capacity of each stage of the register 2. The input 6 is fed from the parallel outputs of a first auxiliary register 8 and a second auxiliary register 9 as alternatives via a two-position multiplexer 10. Each of the registers 8 and 9 contains a multibit storage stage corresponding to each multiplier of the array 3 and, when the multiplexer connects the parallel output of the relevant register 8 or 9 to the input 6, the content of each stage is applied to the bit lines of the input 6 which feed the corresponding multiplier. Thus the contents of the stages of the register 2 are weighted by the contents of the corresponding stages of the register 8 or 9 and the results are added together by the adder 4. The input 7 of the (clocked) shift register 2 is fed from an input terminal 11 via a correspondingly clocked sampling analog-to-digital converter 12. Input terminal 11 is connected to the output of an external signal source (not shown). Input 7 is therefore fed with a succession of samples V in digital form of an analogue input signal applied to terminal 11, these samples being clocked through the register 2 in succession and giving rise to corresponding filtered signal samples in digital form at the output 5.

Output 5 is connected, via a two position demultiplexer 12, as alternatives to either the input of a multiplier 14 or to both the input of a decision element 15 and a first input of a subtractor 16. The output of decision element 15 feeds both an output 17 and also the second input of the subtractor 16. In a known manner decision element 15 takes, on the basis of the potentially distorted signals fed to its input from the output 5, decisions on what these signals would ideally be in the absence of such distortion and produces the results of these decisions on its output, whence they are fed to the output 17. The decisions may be taken, for example, on the basis of a reference to all the possible values which the output signals of converter 12 could have in the absence of distortion or, as another example, on the basis of a reference to the undistorted form of a standard signal a potentially distorted version of which is periodically received on the input terminal 11. The difference e between the successive output signals of decision element 15 and the corresponding signals appearing at the output 5 of filter 1 are calculated by subtractor 16 and are clocked in succession into a shift register 18 via its serial input 19. Shift register 18 has n stages, and its parallel output 20 is connected to the parallel input 21 of the right-hand n stages of register 8, the remaining N-1 left-hand stages of register 8 being loaded with zeros on a permanent basis. The right-hand n stages of register 8 correspond to the n multipliers at the right-hand end of array 3.

Multiplier 14 multiplies the signals fed to it from the filter output 5 by a fixed constant value $\mu$, and applies the result to one input 22 of an adder 23. The other input 24 of adder 23 is fed with the contents of a selected one of the N left-hand stages of register 9 via an N-position multiplexer 25, these N left-hand stages corresponding to the N multipliers at the left-hand end of the array 3 (which contains $N+n-1$ multipliers in all). The remaining stages of register 9 are loaded with zeros on a permanent basis. The output of adder 23 is fed to the input of a selected one of the N left-hand stages of register 9 via an N-position demultiplexer 26, the stages selected by (de)multiplexers 25 and 26 at any given time being the same. Each of the said N left-hand stages also has a respective load signal input (not shown), and that stage which is at any given time selected by demultiplexer 26 also has its load signal input connected through demultiplexer 26 to a further bit input 27 of demultiplexer 26. Control or selection signal inputs 28 and 29 of the (de)multiplexers 25 and 26 respectively are fed from the output 30 of a counter 31 which has a capacity N. A "borrow" signal output 32 of counter 31 is connected to a parallel load input 34 of register 8. Register 8 is therefore loaded each time (decremented) counter 31 is changed to a state in which it controls (de)multiplexers 25 and 26 to select the Nth stage of register 9.

Figure 2:
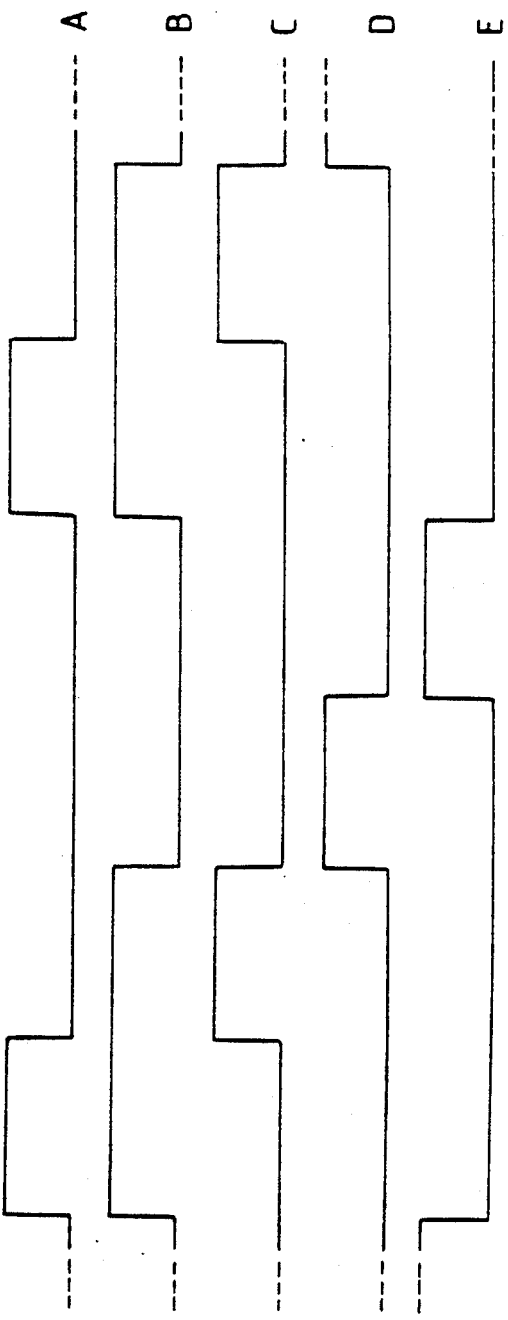
FIG. 2 illustrates the time relationship between some control signals occurring in the embodiment of FIG. 1.

The components 2, 10, 12, 13, 18 and 31 are supplied with clock/control signals from outputs A, B, C, D and E of a clock/control signal generator 35 as shown. The time relationship between these signals is indicated in FIG. 2 of the drawings. Signal A is applied to a sampling control signal input 36 of analog-to-digital converter 12 and to a clock signal input 37 of delay line or shift register 2, so that each time a rising edge occurs in the signal A, a sample is taken of a signal applied to input 11, is converted to digital form, and is clocked into the first stage of register 2. Signal B is applied to select signal inputs 38 and 39 of the (de)multiplexers 10 and 13. A high level in this signal causes multiplexer 10 to connect the parallel output of register 9 to input 6 and demultiplexer 13 to connect output 5 to decision device 15 and subtractor 16, these (de)multiplexers taking up their other selection state when signal B is low. Signal C is supplied to the clock signal input 40 of shift register 18 so that the output of subtractor 16 is loaded into the first stage of register 18 each time a rising edge occurs in signal C. Signal D is applied to the clock signal input 41 of (cyclic) counter 31, so that the content of counter 31 is decremented on each rising edge of signal D. Signal E is applied to the bit line input 27 of demultiplexer 26 so that the stage of register 9 currently selected by demultiplexer 26 is loaded with the output of adder 23 each time a rising edge occurs in the signal E.

In operation successive digital samples V of a signal applied to input 11 are clocked into shift register or delay line 2 under the control of signal A. During the first half of each sample period (signal B high) the corresponding output I of filter 1, using the contents of register 9 as the respective weighting coefficients C, appears on output 17 after processing by the decision element 15. Moreover, the difference $(e)=I-V$ between the input signal V to and the output signal I from decision element 15 is clocked into shift register 18 under the control of signal C. It will be noted that only the samples in the first N stages at most of register 2 contribute to the signal at output 17, because the contents of the stages of register 9 which correspond to the remaining stages of register 2 are permanently zero. The arrangement therefore operates effectively as an N-tap filter, even though register 2 comprises more than N stages.

During the second half of each sample period (signal B low) the contents e of register 8 are used for the filter weighting coefficients (only the samples in the last n stages at most of register 2 contributing to the resulting signal applied to multiplier 14 because the contents of the stages of register 8 which correspond to the remaining stages of register 2 are permanently zero). The resulting output of multiplier 14 is used to correct, under the control of signal E, the weighting coefficient contained in that stage of register 9 which is currently being selected by (de)multiplexers 25 and 26 under the control of counter 31. Because counter 31 is clocked by signal D once for every sample period the N coefficients stored in register 9 are corrected in turn, one per signal sample period, on a cyclic basis, the contents of register 8 being set to the current contents of register 18 prior to each correction of the nth coefficient. It will be apparent from a consideration of the time relationship between the various signals that each of the N coefficients in register 9 is corrected once for every N sample periods in a manner given by the formulae derived above. If $n=N$ the maximum number of signal samples and errors is taken into account for the correction of each coefficient although, as mentioned previously, in some cases satisfactory results may be obtained if less than this number is taken into account, at least for the correction of some coefficients. In other words, in some cases satisfactory results may be obtained if n is less than N.

As an example FIG. 3 illustrates for four successive sample periods $k, k+1, k+2, k+3$, the contents V of the stages of the shift register 2 and, beneath each one, the corresponding weighting coefficients employed during the first and during the second halves of the relevant sample period, for $N=n=3$. $V_1(k)$ is the content of the first stage of the register during the sample period k and $e(k)=I(k)-V(k)$ is the corresponding output of subtractor 16 during the first half of that sample period. It will be seen that during the second half of sample period k the output of multiplier 14 is $\mu[e(k) V_1(k-2)+e(k-1) V_1(k-3)+e(k-2) V_1(k-4)]$, i.e. the required correction for the weighting coefficient $C_3$ for the third stage of the register. Similarly, during the second half of sample periods $k+1, k+2$ and $k+3$ the outputs from multiplier 14 are the required corrections for the weighting coefficients for the second ($C_2$), first ($C_1$) and third ($C_3$) stages of register 2, as required.

It should be noted that an integrated circuit having an architecture corresponding to the combination of the items 1, 8, 9 and 10 is commercially available from Inmos under the type number A100, and such an integrated circuit may be used to implement these components. If this is done the arrangement of the clock/control signal generator 35, (de)multiplexers 25 and 26, and counter 31 will have to be modified somewhat to take into account that with this integrated circuit the various stages of the registers 8 and 9 have to be accessed by applying appropriate address signals to the circuit.

As described so far, one of the N coefficients in register 9 is adjusted for each sample period of the signal applied to input 11. In fact, if desired, more than one coefficient may be adjusted for each said period, enabling the excess of the number of stages of register 2 over N to be reduced while still taking into account the maximum amount of information for the adjustment of each coefficient, albeit at the expense of having to carry out more operations during each sample period. FIG. 4 is a diagram, similar to FIG. 3, showing how it may be arranged that two of the N coefficients are adjusted during the latter part of each sample period. Again in this example register 2 has five stages, but now $N=4$ and each coefficient is adjusted once for every $n=2$ sample periods. During the sample period k, after the error signal e(k) has been derived from the output of the filter it is used as the weighting coefficient for the fourth stage of register 2 and $e(k-1)$ is used as the weighting coefficient for the fifth stage. The output of multiplier 14 is therefore $\mu[e(k) V_1(k-3)+e(k-1) V_1(k-4)]$, i.e. the required correction for weighting coefficient $C_4$ for the fourth stage of register 2. The error signals e(k) and $e(k-1)$ are now used, still during the sample period k, as weighting coefficients for the third and fourth stages of register 2 respectively resulting in the required correction for the weighting coefficient $C_3$ for the third stage of register 2. During the next sample period, after the error signal $e(k+1)$ has been derived from the output of the filter, the error signals e(k) and $e(k-1)$ are again used as weighting coefficients for the third and fourth stages respectively of register 2, resulting in the required correction for the weighting coefficient 2 for the second stage of register 2. The error signals e(k) and $e(k-1)$ are then used, still during the sample period $k+1$, as weighting coefficients for the second and third stages respectively of register 2, giving the required correction for the weighting coefficient $C_1$ for the first stage of register 2. During the next sample period $C_4$ and $C_3$ are corrected once again, and so on. It will be evident that the arrangement of FIG. 1 and various timing interrelationships therein will have to be modified slightly in order to achieve the operations illustrated in FIG. 4 but the modifications required will be readily apparent to a person skilled in the art.

Obviously it is preferable to adjust, as described, each weighting coefficient C immediately as the required correction therefor has been calculated, in order to minimise the settling time of the filter. However in some circumstances satisfactory results may still be obtained if, instead, a plurality of coefficients is adjusted every m sample periods, where m is greater than one. For example, the embodiment of FIG. 1 could be modified so that all the N coefficients in register 9 are adjusted as a group each time the contents of register 18 are written into register 8.

Figure 7:
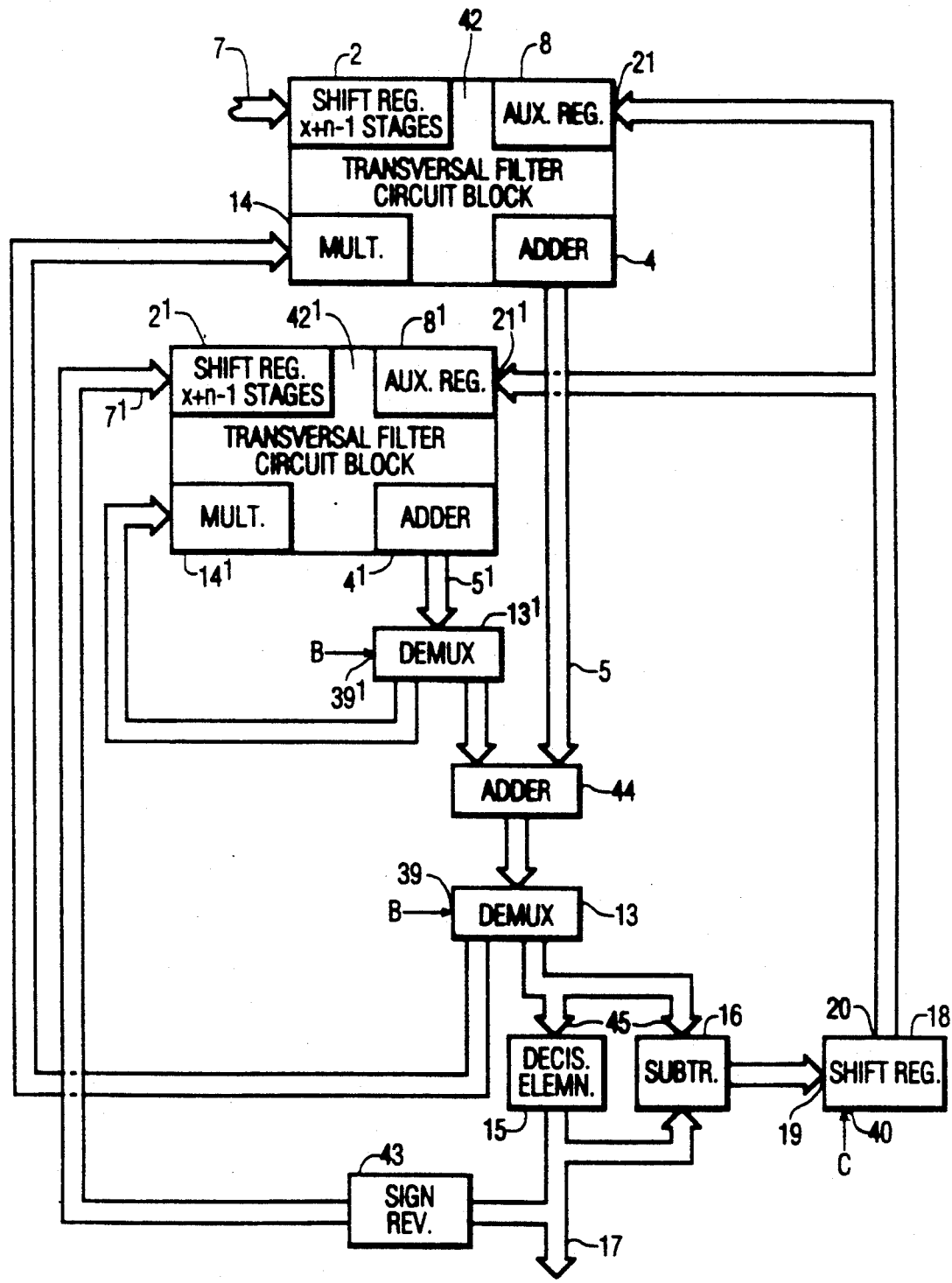
FIG. 7 is a block diagram of another embodiment of the invention in the form of a decision feedback filter using interconnected essentially duplicate transversal filter arrangements illustrated in FIG. 1.

The invention has been described so far in the context of a simple linear filter. It will be evident that it may also be employed, for example, in a filter of the decision feedback type as illustrated in FIG. 7. To this end the filter 1 of FIG. 1 together with items 8–10, 14, 23, 25, 27 and 31 and their interconnections (collectively designated as transversal filter circuit block 42 in FIG. 1) may be duplicated, (duplicate parts being shown with the same reference numeral but with a prime symbol) the duplicate circuit block 42' forming part of the feedback element of the decision feedback filter arrangement. More specifically, the input 7' of the duplicate shift register 2' may be fed from the output 17 via a sign reverser 43, and the signal path from one input to the output of a further added 44, may be included between the output 5 and input of demultiplexer 13 in FIG. 1. That output of duplicate demultiplexer 13' (which corresponds to the one which in FIG. 1 is connected to decision element 15 and subtractor 16) is connected to the other input of the further adder 44, and the output of register 18 is also connected to the parallel input of duplicate register 8'. The counters 31 and its duplicate are in such a case arranged to run in step, so that their contents are always equal to each other; these counters could be replaced by a single common counter if desired. Because of the provision of the sign reverser 43, during the first half of each input signal sample period the appropriately weighted N previous signals I at output 17 are now subtracted in the further adder 44 from the suitably weighted N most recent input signal samples now present in register 2, and the result is applied, as a common output 45 of filter 1 and its duplicate, to decision element 15 and subtractor 15 via multiplexer 13 as required. During the second half of each signal sample period a coefficient in register 9 is adjusted exactly as previously. Moreover a coefficient in the duplicate of register 9 is adjusted in the same way, the same error values e being used as the coefficients for the array 3 and its duplicate. For illustration, FIG. 5 shows on successive lines, for a given sample period k corresponding to the first sample period illustrated in FIG. 3, the respective contents V and V' of register 2 and its duplicate (side by side), the respective weighting coefficients C and C' employed in the array 3 and its duplicate during the first half of the sample period, and the respective weighting coefficients e employed in the array 3 and its duplicate during the second half of the sample period, where $V_1'(k) = -I(k-1)$. In this example a value of three has been chosen for N and n for both filter 1 and its duplicate although it will be evident that other values may be used and that N may be different from n. Indeed the value of N (=X say) chosen for filter 1 may be different to the value of N (=Y say) chosen for the duplicate of filter 1, X+Y forming the number N of coefficients which are adjusted altogether.

It will be evident that two coefficients could alternatively be adjusted in both filter 1 and its duplicate for each input signal sample period, in the manner described above with reference to FIG. 4. Moreover, instead of including a sign reverser between the output 17 and the input of the duplicate of filter 1, the signs of the coefficients C' may themselves be reversed.

Figure 6:
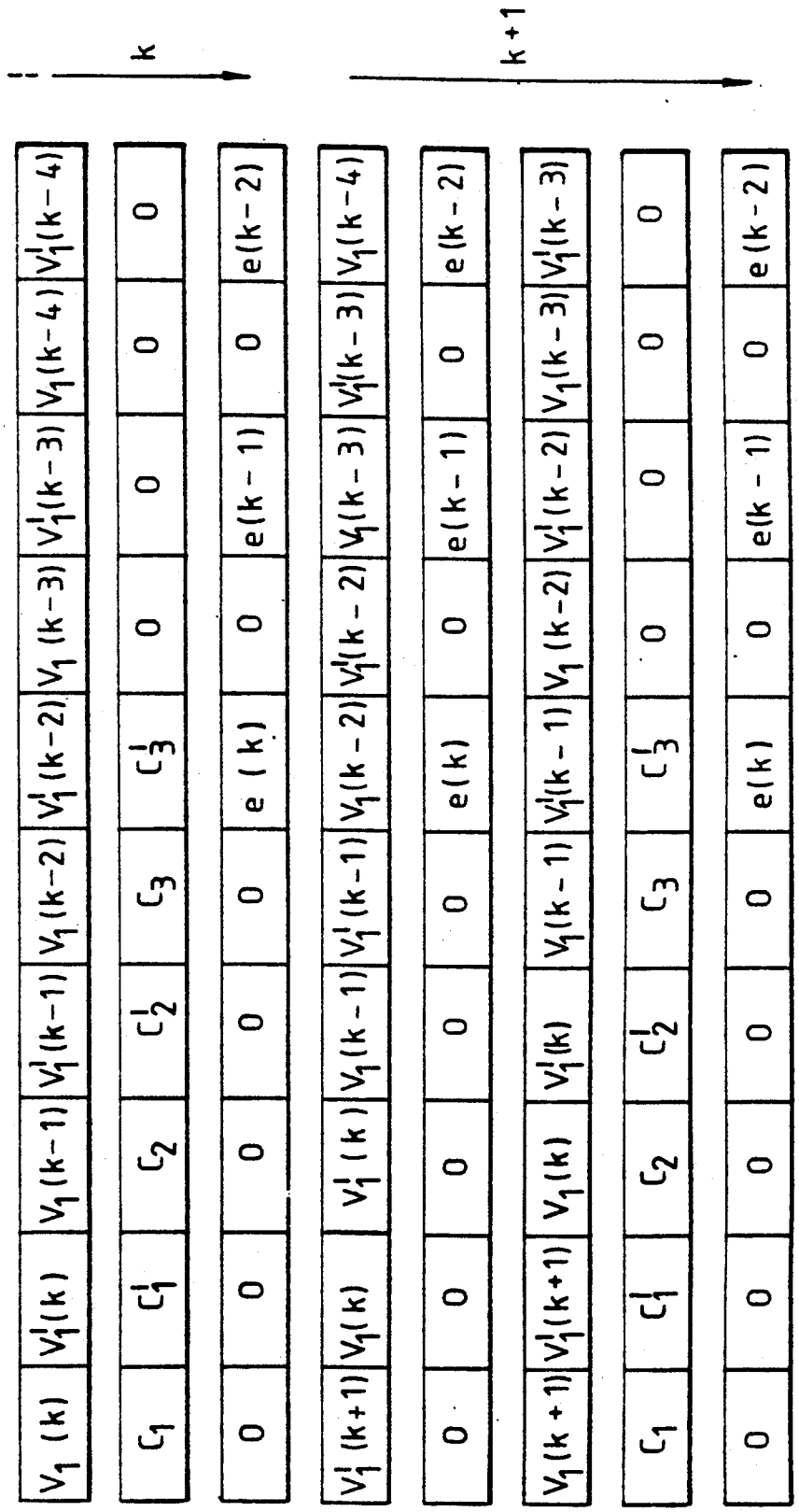
FIG. 6 illustrates some information signals occurring in yet another modified version of the embodiment of FIG. 1.

If desired the decision feedback filter arrangement described above may be modified so that only a single transversal filter 1 is employed, albeit of double length and albeit at the expense of having to increase the lengths of registers 8 and 9 and to carry out more operations serially during each input signal sample period. To this end, instead of connecting the output 17 of FIG. 1 to a duplicate of filter 1 via a sign reverser it may be connected, via the sign reverser and one input and the output of a multiplexer, to the input 7 of filter 1, the output of the analog-to-digital converter being connected to the other input of this multiplexer. In such a case this multiplexer may be controlled to connect the output of converter 12 to input 7 during a first portion of each sample period of the input signal and to connect the output 17 to input 7 during a second portion of each period, shift register 2 now being clocked at double rate so that input signal samples V and the resulting output signals I are clocked into the register alternately, producing a content of register 2 as illustrated in the first line of FIG. 6 at a specific time, where $V'(k) = -I(k-1)$. While this content is present it is now arranged that the two sets of weighting coefficients illustrated on the second and third lines of FIG. 3 are employed in succession while demultiplexer 13 connects output 5 to items 15 and 16, and to multiplier 14, respectively. Thus during the first of these periods $I(k)$ is produced at output 17 and $e(k)$ is produced by subtractor 16, and during the second of these periods multiplier 14 produces the correction for coefficient $C_3'$. Register 2 is now clocked (fourth line of FIG. 6) while maintaining the weighting coefficients the same (fifth line) and demultiplexer 13 in the state in which it connects output 5 to multiplier 14. Thus multiplier 14 now produces the correction for $C_3$. Register 2 is now clocked once again (sixth line of FIG. 6) and the two sets of weighting coefficients illustrated on the seventh and eighth lines of FIG. 6 are employed in succession while demultiplexer 13 connects output 5 to items 15 and 16 and to multiplier 14 respectively. Thus during the first of these periods $I(k+1)$ is produced at output 17 and $e(k+1)$ is produced by subtractor 16, and during the second of these periods multiplier 14 produces the correction for $C_2'$. Analogous operations are performed subsequently, resulting in the generation of the correction for $C_2$, $I(k+2)$ and $e(k+2)$, the corrections for $C_1'$ and $C_1$, and $I(k+3)$ and $e(k+3)$, after which the new errors are loaded into register 8 and the cycle repeats as from the third line of FIG. 6. It will be noted that one of the N=6 coefficients is adjusted for each signal sample applied to the filter, so that each is adjusted once for every n=6 samples, that each correction is derived from n/2=3 error signals, and that n−2=4 further stages are provided in the filter subsequent to the first N stages.

Obviously some modifications will have to be made to the arrangement of FIG. 1, and especially to the control pulse generator 35, to achieve the succession of operations described with reference to FIG. 6, but these will be readily apparent to a person skilled in the art. Again, instead of including a sign reverser between the output 17' and the multiplexer supplying the input 7 of filter 1 the signs of the coefficients C' may themselves be reversed.

From reading the present disclosure, other modifications will be apparent to persons skilled in the art. Such modifications may involve other features which are already known in the design, manufacture and use of filter arrangements and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A transversal filter apparatus comprising:
    K=N+n−1 successive shift register stages, where N and n are integers greater than one and m=N/n is an integer greater than zero, a first stage of said K successive stages having an input for receiving successive input signal samples;
    first register means for storing a first subset of N coefficients;
    second register means for storing a second subset of n coefficients;
    multiplier means responsive to said first and second register means for applying first and second ordered sets of K coefficients as weights to the contents of said K stages in respective first and second half cycles per input signal sample, the first N coefficients of said first set being said first subset and last n−1 coefficients of the first set being zero, the first $N-1$ coefficients of the second set being zero and the last n coefficients of said second set being said second subset;

means for adding the thereby weighted contents of said K stages to produce a filter output signal in said first half cycle and to produce a coefficient adjusting output signal in said second half cycle;

means for forming a difference between the filter output signal and a reference signal;

means coupled to the second register means for updating the stored second subset of coefficients with said difference such that the second subset comprises the differences formed in the last n successive second half cycles; and means coupled to the first register means for adjusting m of the stored first subset of coefficients as a function of the coefficient adjusting output signal in a manner that each of the first subset of coefficients is adjusted only once for each n successive input samples received.

2. The apparatus of claim 1 wherein $m=1$.

3. The apparatus of claim 1 where $m=2$.

4. A transversal filter method comprising:

receiving successive input signal samples at a first of $K=N+n-1$ successive shift register stages, where N and n are integers greater than one and $m=N/n$ is an integer greater than zero;

applying first and second ordered sets of K coefficients as weights to the contents of said K stages in respective first and second half cycles per input signal sample, the last $n-1$ coefficients of the first set and the first $N-1$ coefficients of the second set being zero;

adding the thereby weighted contents of said K stages to produce a filter output signal in said first half cycle and to produce a coefficient adjusting output signal in said second half cycle;

forming a difference between the filter output signal and a reference signal;

updating the second set of coefficients with said difference such that the last n coefficients of said second set comprises the differences formed in the last n successive second half cycles; and adjusting m of the first N coefficients of the first set as a function of the coefficient adjusting output signal in a manner that each of the first N coefficients of the first set is adjusted only once for each n successive input samples received.

5. The method of claim 4 wherein $m=1$.

6. The method of claim 4 where $m=2$.

7. A decision feedback filter apparatus:

a first group of $K1=X+n-1$ successive shift register stages and a second group of $K2=X+1$ successive shift register stages, where X, Y and n are integers greater than one, a first stage of the first group having an input for receiving successive input signal samples, a first stage of the second group having an input for receiving a decision feedback signal;

register means for storing a first subset of X coefficients, a second subset of Y coefficients and a third subset of n coefficients;

multiplier means responsive to said register means for applying first and second ordered sets of K1 coefficients as weights to the contents of said K1 stages of said first group and first and second ordered sets of K2 coefficients as weights to the contents of said K2 stages of said second group in respective first and second half cycles per input signal sample, the first X coefficients of the first set of K1 coefficients being said first subset, the first Y coefficients of the first set of K2 coefficients being said second subset and the last $n-1$ coefficients of both the first set of K1 coefficients and the second set of K2 coefficients being zero, the first $X-1$ coefficients of said second set of K1 coefficients and the first $Y-1$ coefficients of said second set of K2 coefficients being zero and the last n coefficients of both the second set of K1 coefficients and the second set of K2 coefficients being said third subset;

means for adding the thereby weighted contents of said first and second groups of stages, to produce a common output signal in said first half cycle and to produce respective first and second coefficient adjusting output signals in said second half cycle;

a decision element having an input fed by said common output signal and having an output at which is formed a decision output signal;

means between the output of said decision element and the input of the second group of stages for forming said decision feedback signal from said decision output signal;

means for forming a difference between the common output signal and the decision output signal;

means coupled to said register means for updating the stored third subset of coefficients with said difference such that the third subset comprises the differences formed in the last n successive second half cycles; and means coupled to the register means for adjusting at least one of the stored first subset of coefficients as a function of the first coefficient adjusting output signal and for adjusting at least one of the stored second subset of coefficients as a function of the second coefficient adjusting output signal.

8. A decision feedback filter method comprising:

receiving successive input signal samples at a first stage of a first group of $K1=X+n-1$ successive shift register stages, where X and n are integers greater than one;

inputting a decision feedback signal at a first stage of a second group of $K2=Y+n-1$ successive shift register stages, where Y is an integer greater than one;

storing a first subset of X coefficients, a second subset of Y coefficients and a third subset of n coefficients;

applying first and second ordered sets of K1 coefficients as weights to the contents of said K1 stages of said first group and first and second ordered sets of K2 coefficients as weights to the contents of said K2 stages of said second group in respective first and second half cycles per input signal sample, the first X coefficients of the first set of K1 coefficients being said first subset, the first Y coefficients of the first set of K2 coefficients being said second subset and the last $n-1$ coefficients of both the first set of K1 coefficients and the second set of K2 coefficients being zero, the first $X-1$ coefficients of said second set of K1 coefficients and the first $Y-1$ coefficients of said second set of K2 coefficients being zero and the last n coefficients of both the second set of K1 coefficients and the second set of K2 coefficients being said third subset;

adding the thereby weighted contents of said first and second groups of stages, to produce a common output signal in said first half cycle and to produce respective first and second coefficient adjusting output signals in said second half cycle;

forming a decision output signal in response to the common output signal;

forming said decision feedback signal in response to said decision output signal;

forming a difference between the common output signal and the decision output signal;

updating the stored third subset of coefficients with said difference such that the third subset comprises the differences formed in the last n successive second half cycles;

adjusting at least one of the stored first subset of coefficients as a function of the first coefficient adjusting output signal; and adjusting at least one of the stored second subset of coefficients as a function of the second coefficient adjusting output signal.

* * * * *